US008368413B2

(12) United States Patent  
Kanev et al.

(10) Patent No.: US 8,368,413 B2
(45) Date of Patent: Feb. 5, 2013

(54) METHOD FOR TESTING ELECTRONIC COMPONENTS OF A REPETITIVE PATTERN UNDER DEFINED THERMAL CONDITIONS

(76) Inventors: Stojan Kanev, Sacka (DE); Frank Fehrmann, Baβlitz (DE); Jens Fiedler, Dresden (DE); Claus Dietrich, Sacka (DE); Jörg Kiesewetter, Sacka (DE)

( * ) Notice: Subject to any disclaimer, the term of this patent is extended or adjusted under 35 U.S.C. 154(b) by 0 days.

(21) Appl. No.: 13/119,916

(22) PCT Filed: Sep. 1, 2009

(86) PCT No.: PCT/EP2009/061274
§ 371 (c)(1),
(2), (4) Date: May 26, 2011

(87) PCT Pub. No.: WO2010/031685
PCT Pub. Date: Mar. 25, 2010

(65) Prior Publication Data
US 2011/0221461 A1  Sep. 15, 2011

(30) Foreign Application Priority Data

Sep. 19, 2008 (DE) .......................... 10 2008 048 081

(51) Int. Cl.
*G01R 31/00* (2006.01)
(52) U.S. Cl. .................................. 324/750.03
(58) Field of Classification Search .................. None
See application file for complete search history.

(56) References Cited

U.S. PATENT DOCUMENTS 5,532,609 A * 7/1996 Harwood et al. ......... 324/750.14
5,604,444 A * 2/1997 Harwood et al. ......... 324/750.14
(Continued)

FOREIGN PATENT DOCUMENTS

DE         2628519      12/1976
DE         10317778     11/2004
WO         WO 02/07192   1/2002

OTHER PUBLICATIONS

English-language abstract of United Kingdom Patent No. GB1541274, which corresponds to German Publication No. DE 2628519, published Dec. 30, 1976.

(Continued)

Primary Examiner — Paresh Patel
(74) Attorney, Agent, or Firm — Dascenzo Intellectual Propert Law, P.C.

(57) ABSTRACT

The invention relates to a method for testing several electronic components (1) of a repetitive pattern under defined thermal conditions in a prober, which comprises a chuck (10) for holding the components (1) and special holding devices (15) for holding individual probes (12). For testing, the components (1) are adjusted to a defined temperature, the probes (12) and a first electronic component (1) are positioned relative to each other by means of at least one positioning device, contact pads (3) of the electronic component (1) are subsequently contacted by the probes (12) so that the component (1) can be tested and then the positioning and the contacting can be repeated for testing another component (1) of the repetitive pattern. In order to shorten the test time for measurements at changing temperatures while ensuring reliable contacting of the components by using individual probes, a component (1) is positioned and contacted by a first positioning step which jointly affects all probes (12) first being carried out in an intermediate position, in the result of which the component (1) lies at a defined distance under the probe tips (13), the position of each individual probe tip (13) being subsequently corrected by means of separate manipulators to the position of the corresponding contact pad (3) to be contacted with the particular probe tip (13) so that each probe tip (13) lies above a contact pad (3), and the probe tips (13) further subsequently being brought into contact with the contact pads (3) of the component (1) by means of an advancing movement.

12 Claims, 2 Drawing Sheets

U.S. PATENT DOCUMENTS

Figure 1:
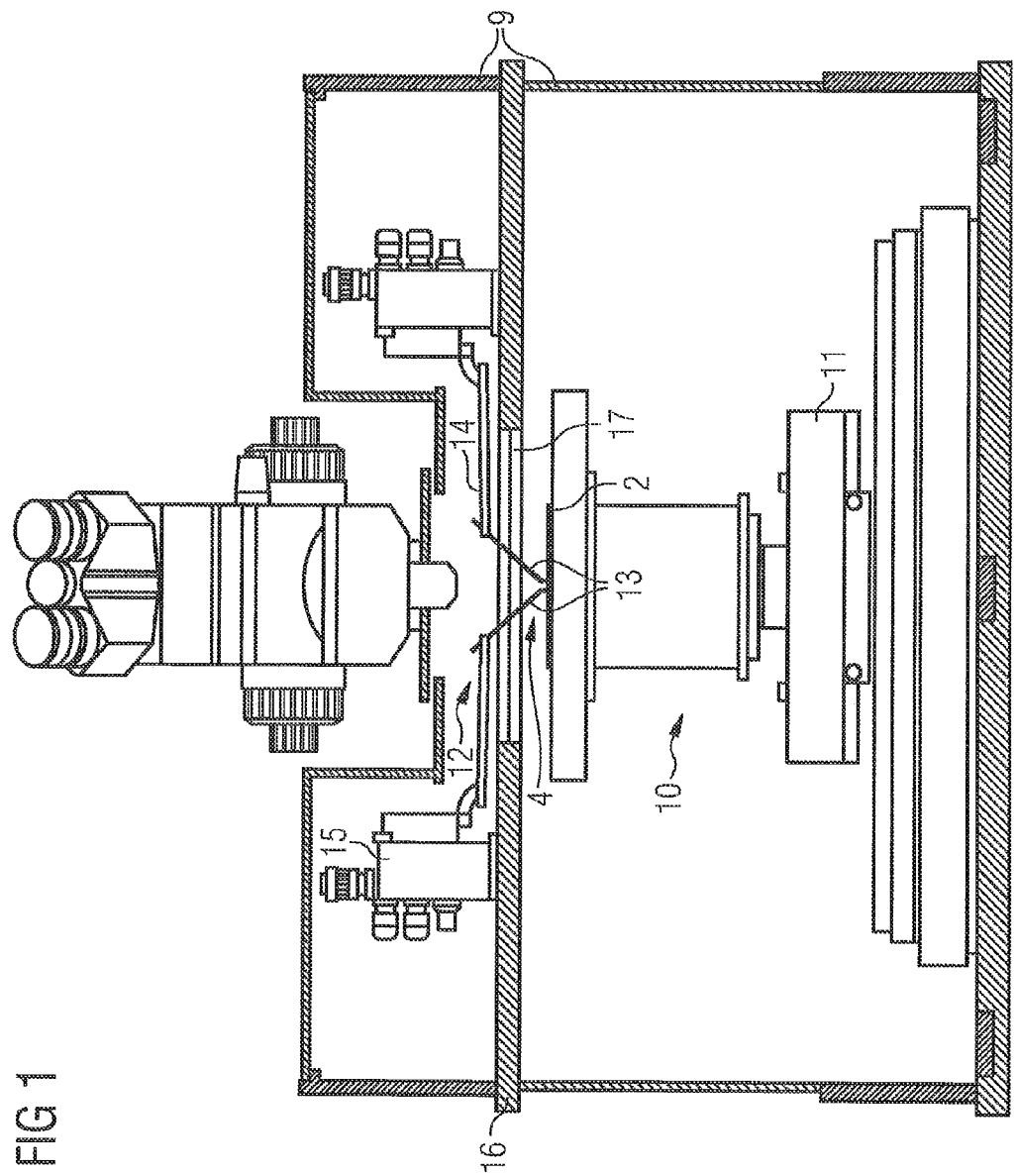

| | | | |
|---|---|---|---|
| 5,835,997 A * | 11/1998 | Yassine | 324/750.14 |
| 6,198,299 B1 | 3/2001 | Hollman | |
| 6,621,282 B2 * | 9/2003 | Hollman | 324/750.03 |
| 7,180,317 B2 * | 2/2007 | Hollman | 324/750.08 |
| 7,221,146 B2 * | 5/2007 | Dunklee et al. | 324/754.01 |
| 7,235,990 B1 * | 6/2007 | Kreissig et al. | 324/750.27 |
| 7,368,925 B2 * | 5/2008 | Navratil et al. | 324/754.23 |
| 2003/0172527 A1 | 9/2003 | Kitai et al. | |
| 2004/0070415 A1 * | 4/2004 | Schneidewind et al. | 324/760 |
| 2007/0290703 A1 * | 12/2007 | Hollman | 324/760 |
| 2008/0116917 A1 * | 5/2008 | Kanev et al. | 324/754 |

OTHER PUBLICATIONS

English-language abstract of U.S. Patent Publication No. 2004/0208355, which corresponds to German Publication No. DE 10317778, published Nov. 4, 2004.

* cited by examiner

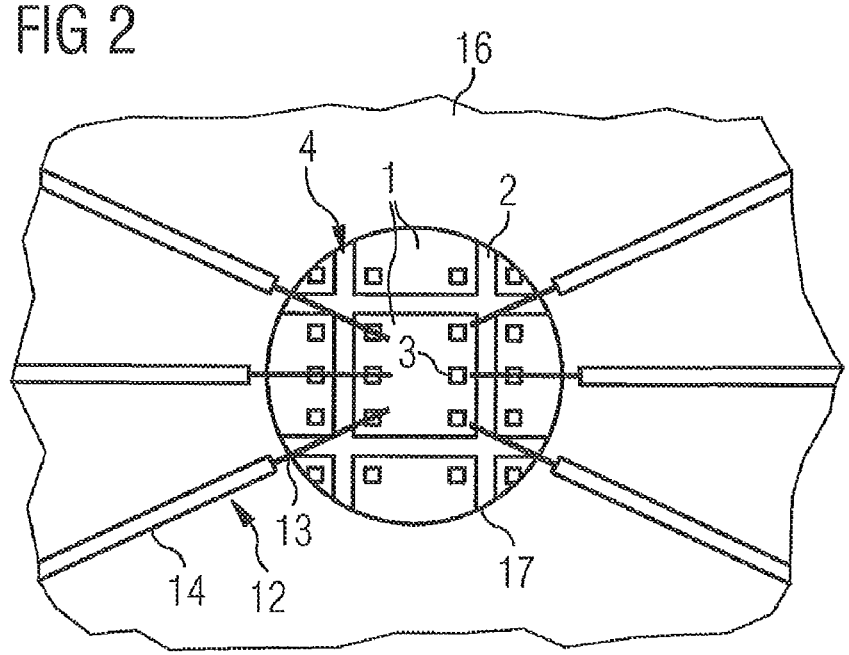
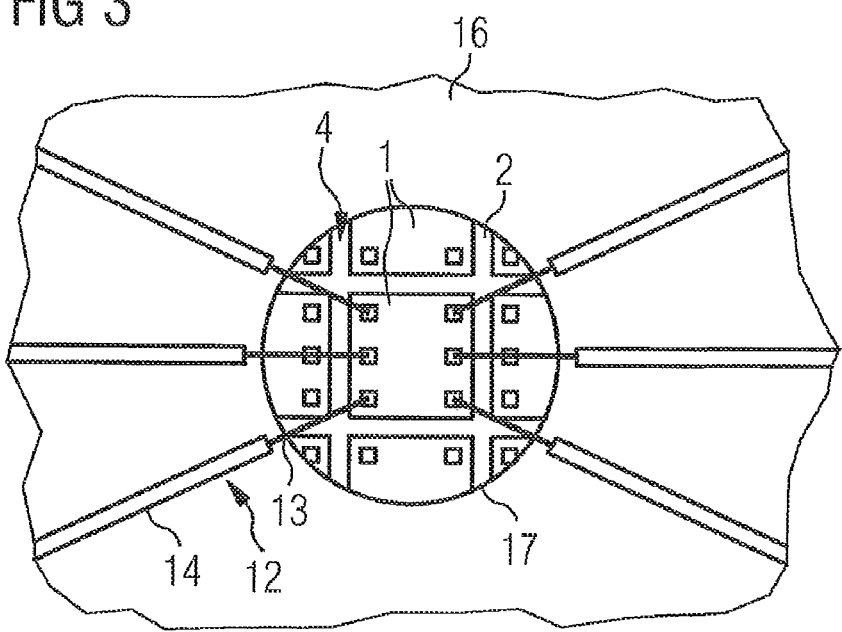

METHOD FOR TESTING ELECTRONIC COMPONENTS OF A REPETITIVE PATTERN UNDER DEFINED THERMAL CONDITIONS

The invention relates to a method for testing an electronic component under defined thermal conditions. The component to be tested has a plurality of contact islands, on which the component to be tested is electrically contacted by means of at least two probes for feeding-in or picking-up a test signal by means of the probes.

Such testing is conducted in a testing device, referred to as a prober, in which it is also possible to set the ambient conditions, such as e.g. a defined temperature, that are required for the test. In the prober, the component is held by a chuck, i.e. by a holding device for the component, which holding device is adapted to the possible holder of the test object, to the contacting thereof and to the test conditions. The component is set to the specified temperature by means of the chuck or other suitable devices. Probes, which are held by one or more probe holders, and the electronic component, are positioned relative to one another for the purposes of testing by means of at least one positioning apparatus, and the contact islands of the electronic component are thereupon contacted by free needle tips of the probes.

Electronic components are tested during different production stages and, therefore, they are also tested in the wafer assemblage, wherein a multiplicity of components with a repetitive pattern are formed on the wafer. Alternatively, a multiplicity of isolated electronic components with a comparable repetitive pattern can also be arranged on the chuck.

Such arrangements of components are contacted electrically by means of probes during the testing of repetitive patterns, which probes are fixedly mounted on a so-called probe card and electrically contacted via the probe card. This affords the possibility of mounting a multiplicity of probes, which are required for electrically contacting a component at the same time, in such an arrangement that correlates with the arrangement of the contact islands to be contacted at the same time. The probe card, which is held by the probe holder, synchronously positions all probes, places said probes onto the contact islands to be contacted at the same time, and tests the component, whereupon the probe card is positioned with respect to the next component. This allows effective testing of a large number of components in a repetitive pattern, wherein the grid dimensions of the repetitive pattern prescribe the positioning processes from one component to the next and allow automation. In this case, initial positioning takes place with respect to a reference object, e.g. with respect to a first component of the repetitive pattern, and, using this as a starting point, all further positioning is conducted on the basis of the known grid dimensions.

It is also expedient to use needle cards for testing under defined thermal conditions; these should in this case be understood as meaning conditions that differ from the ambient temperature. This is because the metallic probes mounted on a needle card can remain very short as a result of being held on the needle card consisting of plastic, and often consisting of a printed circuit board. Compared to individual probes that have a relatively long probe arm as a connector to the probe holder, which is arranged at a distance from the contacting region, the use of needle cards can avoid a change in the position of the needle tip resulting from a change in the thermal expansion in the case of a change or drift in the temperature during the test, or this can at least reduce the effect of thermal expansion to an extent where the needle tips do not leave the contact islands over the course of the test. After a settling time, such thermal conditions have arisen at the chuck, the probes, and the probe holder that a displacement of the needle tips, which results from a temperature drift, is limited to within acceptable tolerances, even for relatively long periods of contact. If the temperature during the test changes, the settling time needs to be observed before the next contacting may take place. It is also for this reason that the probes mounted on needle cards are effective for relatively large test numbers at unchanging temperatures.

DE 103 17 778 A1 describes a positioning method, in which structures are contacted, which are so small that they can no longer be resolved to a sufficient extent by optical observation. In the process, the first of the repeating positions on the needle arrangement, which first position is relative to the contact surfaces of a component to be contacted, is established very precisely by using atomic force microscopy in order thereupon to undertake post-corrections by optical means, which post-corrections are not subject to a relevant influence by the blur of the optical images. This method can compensate for thermal displacements of the entire component, but it cannot compensate for displacements within the component.

Since the needle card must be adapted to a specific component in terms of position and number of probes, and in terms of the electrical connections to each probe produced on the probe card, the production of the needle cards is very cost intensive and only effective for testing a large number of identical components.

However, in laboratories it is often only individual quantities of components that are tested and this would not justify producing needle cards. It is for this reason that individual probes are used in these applications, which individual probes are mounted relative to one another on a common probe holder, or on individual probe holders, in accordance with the contact-island arrangement of the current component type to be tested. However, the use of such individual probes requires thermal equilibrium to be reached after each change in the temperature during the test in order to test a repetitive pattern of components in succession by means of an arrangement, produced at the outset, of individual probes, which are relative to one another, and in order to ensure reliable contacting between the probes and all components. Setting the thermal equilibrium requires a very high proportion of testing time and energy.

Hence, the invention is based on the object of specifying a method for testing components by means of individual probes, which method is suitable for testing a relatively large number of electronic components of a repetitive pattern at temperatures that deviate from the ambient temperature and which method, whilst ensuring reliable contacting of the components, allows a reduction in the time required during the test for measurements at varying temperatures.

The specified method for the test even allows the compensation of displacements in relative positions within the structure of the test object itself in addition to displacements from component to component in the repetitive pattern resulting from thermal drift.

The described positioning and contacting method allows testing of all components of a repetitive pattern in temperatures that deviate from the ambient temperature without having to wait for thermal equilibrium to be reached. This can significantly reduce the duration of the test.

The invention is intended to be explained in more detail below on the basis of an exemplary embodiment. In the associated drawing FIG. 1 shows a prober for testing a wafer with a multiplicity of components, FIG. 2 shows the work region of a prober with a wafer positioned in an intermediate position, and FIG. 3 shows the work region as per FIG. 2 in the state where the probes come into contact with a component.

The basic design of the test arrangement of a prober is illustrated in FIG. 1. A wafer 2 is arranged on a chuck 10 within a housing 9 of the prober and comprises a multiplicity of electronic components 1 that have the same configuration and are arranged on a regular grid, which is described as a repetitive pattern in this case. As a result of the same configuration, each component 1 of the repetitive pattern has the same arrangement of a plurality of contact islands 3, which are contacted at the same time by respectively one probe 12 for testing the component 1.

The chuck 10 comprises a chuck drive 11, by means of which the wafer 2 can be moved in the X-Y plane, i.e. in the plane of the wafer surface, and in the Z-direction perpendicular thereto, and by means of which said wafer can be rotated about an angle theta about a central axis of the chuck 10, which axis runs in the Z-direction. The chuck 10 can be heated in order to heat the wafer 2 to the temperature required for the test. Alternatively, or in addition thereto, the chuck 10 can also be cooled. The method for testing the components 1 of the wafer 2 described below can be applied equally well at temperatures above and below the ambient temperature around the prober.

A probe-holder plate 16, on which a plurality of probe holders 15, the so-called probe heads, are mounted, is arranged at a distance from the wafer 2 and opposite to the chuck 10, and hence opposite to the wafer 2 as well. Each probe holder 15 carries a probe 12, which consists of a probe arm 14 and a probe tip 13. The probe-holder plate 16 has a central opening 17, through which the probe tips 13 project in the direction of the wafer 2. This central opening 17 defines the maximum extent of a work region 4, in which the probe tips 13 contact the component 1 through the central opening 17, and the region of all contact islands 3 of a component 1 defines the minimum extent of said work region.

Each probe holder 15 comprises a motor-driven manipulator (represented by arrows for the possible movement directions), by means of which each probe 12 can be moved, independently of the others, in the X-, Y- and Z-directions. The probes 12 are pre-mounted on the probe-holder plate 16 such that the arrangement of the probe tips 13 is situated above the work region 4 of the central opening 17 of the probe-holder plate 16, all probe tips 13 end in a plane in the Z-direction and correlates with the arrangement of the contact islands 3 of the components 1 at an initial temperature. Moreover, there is an angular alignment of the contact-island arrangement with respect to the probe arrangement.

Before the first component 1 is tested, the chuck 10 is used to set the wafer 2 to the test temperature, which differs from the initial temperature. In a first positioning step, the chuck drive 11 is used to position the wafer 2 in an intermediate position (FIG. 2), in which the first component 1 is arranged in the work region 4 below the central opening 17 of the probe-holder plate 16 and is arranged at such a distance from said opening that the probe tips 13 can safely reach the contact islands 3 of the component 1 when they pass through the central opening 17 in the probe-holder plate 16.

Alternatively, in the first positioning step, the wafer 2 can also be positioned in such an intermediate position under observation, in which intermediate position the probe tips 13 are over the work region 4 such that in the Z-direction one of the probes 12 is situated above the contact island 3 to be contacted by this probe 12.

In the set intermediate position, the position of the probe tips 13 is compared to the position of the contact islands 3 by means of an image-recognition method. Provided that the components 1 are tested at ambient temperature, or provided that the thermal equilibrium of the testing system has been reached before this first positioning step and hence the position of the probe tips 13 too no longer changes, or only changes by a negligible amount, as a result of thermal expansion, all probe tips 13 will be situated over a contact island 3 as a result of the above-described pre-mounting of the probes 12 and the alignment with respect to the contact-island arrangement. However, the described positioning and contacting method allows testing of all components 1 of the wafer 2 at temperatures that differ from the ambient temperature, without needing to wait for thermal equilibrium to be reached.

If it is determined that there is a deviation of one or more probe tips 13 from the position above the respective contact island 3 in the intermediate position, each deviation is established computationally by means of a suitable method, e.g. by means of a pattern-recognition method, and a control signal for every relevant manipulator is generated therefrom in order to correct the position of the diverging probe 12. Alternatively, both the comparison of the positions and the correction thereof, or at least one of the two steps, can be conducted manually. Only after each probe tip 13 has thus been individually aligned with respect to the associated contact island 3 in the intermediate position of the component 1 is the feed motion in the Z-direction brought about between all probes 12 and the component 1 until the probe tips 13 butt against the contact islands 3 and a secure contact is established (FIG. 3). This feed motion can be brought about by the chuck drive 11 or else by the manipulators of the probe holders 15, but in any case it is brought about in the same manner for all probes 12.

After making contact with the component 1, the latter is tested either by feeding an electrical test signal into the component 1 via the probes 12 and/or by picking up said electrical test signal from the component by the probes and evaluating the signal; this depends on the type of component 1 and testing method.

In order to test the next component 1 in the repetition pattern, the probe tips 13 are lifted off the contact islands 3 and the chuck 10 is displaced in the X- or Y-direction, or in both directions, as far as the next component position in accordance with the grid dimensions of the repetition pattern such that the probe tips 13 are situated over the contact island region of this component 1. As a result, the first positioning step for the next component 1 has been carried out and the intermediate position for contacting said component has been reached. Continuous repetition of the method steps described above for a first component allows successive testing of all components 1 of the wafer 2, even if there is a change in the temperature of the probes 12, and hence there is a change in the position of the probe tips 13 in respect of the probe holder 15, over the course of the entire wafer testing.

List of Reference Signs

1 Component
2 Wafer
3 Contact island
4 Work area
9 Housing
10 Chuck
11 Chuck drive
12 Probe
13 Probe tip 14 Probe arm
15 Probe holder
16 Probe-holder plate
17 Central opening

The invention claimed is:

1. A method for testing a plurality of electronic components (1) of a repetitive pattern under defined thermal conditions in a prober, which has a chuck (10) for holding the plurality of electronic components (1) and probe holders (15) for holding individual probes (12) having corresponding probe tips (13), wherein the plurality of electronic components (1) have contact islands (3) for contacting the plurality of electronic components by means of the probes (12), the method comprising:

setting the plurality of the electronic components (1) to a defined temperature;

positioning the probes (12) and a first electronic component (1) of the plurality of electronic components relative to one another by means of at least one positioning apparatus;

subsequently contacting the contact islands (3) of the first electronic component (1) by the probes (12);

testing the first electronic component (1); and following this, repeating the positioning and the contacting of the plurality of electronic components of the repetitive pattern and testing for a second electronic component (1) of the plurality of electronic components, wherein the repeating is characterized in that positioning and contacting of the second electronic component (1) is conducted by:

conducting a first positioning step, which jointly relates to all of the probes (12), into an intermediate position, as a result of which the second electronic component (1) is situated in a work region (4), in which the contacting will take place, and is situated at a defined distance below probe tips (13);

correcting a position of each individual probe tip (13) to a position of a corresponding contact island (3) of the second electronic component (1) to be contacted by the respective probe tip (13) by means of separate manipulators that are associated with each probe (12) such that each probe tip (13) is situated over the corresponding contact island (3) of the second electronic component (1); and contacting the probe tips (13) with the contact islands (3) of the second electronic component by means of a feed motion between all of the probe tips (13) and the second electronic component.

2. The method as claimed in claim 1, characterized in that the position of the individual probe tips (13) and the position of the corresponding contact islands (3) of the second electronic component (1) to be contacted are registered by means of image recognition and this is used to establish the required corrections to the positions of the individual probe tips (13) with respect to the corresponding contact islands (3).

3. The method as claimed in claim 2, characterized in that the correcting includes generating a control signal that controls an operation of a manipulator that is associated with an individual probe tip.

4. The method as claimed in claim 1, characterized in that the corrections to the positions of the probes (12) are conducted by motorized manipulators.

5. The method as claimed in claim 4, characterized in that the positioning and contacting of the electronic components (1) in the repetitive pattern is conducted automatically.

6. The method as claimed in claim 4, characterized in that the intermediate position of each successive positioning and contacting process is reached by running over a grid dimension in the repetition pattern.

7. The method as claimed in claim 1, characterized in that the correcting includes moving at least one probe tip independently from at least one other probe tip.

8. The method as claimed in claim 1, characterized in that the conducting a first positioning step includes displacing the chuck in at least one of an X-direction and a Y-direction in accordance with a grid dimension of the repetitive pattern.

9. The method as claimed in claim 1, characterized in that, subsequent to the setting, the method includes performing a remainder of the method without waiting for a thermal equilibration to be reached.

10. The method as claimed in claim 1, characterized in that the defined temperature is different from an ambient temperature.

11. The method as claimed in claim 1, characterized in that the defined temperature is a first defined temperature, and subsequent to the testing the first electronic component and prior to the repeating, the method further includes setting the electronic components to a second defined temperature that is different from the first defined temperature.

12. The method as claimed in claim 11, characterized in that the method further includes performing the repeating without waiting for a thermal equilibration to be reached.

* * * * *

UNITED STATES PATENT AND TRADEMARK OFFICE
CERTIFICATE OF CORRECTION

PATENT NO. : 8,368,413 B2  Page 1 of 1
APPLICATION NO. : 13/119916
DATED : February 5, 2013
INVENTOR(S) : Kanev et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 31 days.

Signed and Sealed this
First Day of September, 2015

Michelle K. Lee
*Director of the United States Patent and Trademark Office*